United States Patent
Xu et al.

(10) Patent No.: US 12,095,303 B2
(45) Date of Patent: Sep. 17, 2024

(54) METHOD AND DEVICE FOR DETECTING CHARGING ABNORMALITY, AND STORAGE MEDIUM

(71) Applicant: CONTEMPORARY AMPEREX TECHNOLOGY CO., LIMITED, Ningde (CN)

(72) Inventors: Guangyu Xu, Ningde (CN); Haili Li, Ningde (CN); Wei Zhao, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 416 days.

(21) Appl. No.: 17/707,780

(22) Filed: Mar. 29, 2022

(65) Prior Publication Data
US 2022/0320886 A1 Oct. 6, 2022

Related U.S. Application Data

(63) Continuation of application No. PCT/CN2021/085115, filed on Apr. 1, 2021.

(51) Int. Cl.
*H02J 7/00* (2006.01)
*G01R 31/367* (2019.01)
*G01R 31/3835* (2019.01)

(52) U.S. Cl.
CPC ........ *H02J 7/00712* (2020.01); *G01R 31/367* (2019.01); *G01R 31/3835* (2019.01); *H02J 7/0029* (2013.01); *H02J 7/0047* (2013.01)

(58) Field of Classification Search
CPC .............................. G01R 31/36–396
See application file for complete search history.

(56) References Cited

U.S. PATENT DOCUMENTS

| 4,433,294 A | * | 2/1984 | Windebank | .......... G01R 31/385 |
| | | | | 324/426 |
| 2008/0191667 A1 | * | 8/2008 | Kernahan | ............. H01M 10/48 |
| | | | | 320/160 |

(Continued)

FOREIGN PATENT DOCUMENTS

| CN | 101622547 A | 1/2010 |
| CN | 102043132 A | 5/2011 |

(Continued)

OTHER PUBLICATIONS

International Search Report for Application No. PCT/CN2021/085115, mailed Jan. 4, 2022.

(Continued)

*Primary Examiner* — Drew A Dunn
*Assistant Examiner* — Tynese V McDaniel
(74) *Attorney, Agent, or Firm* — Ladas & Parry LLP

(57) ABSTRACT

This application provides a method and device for detecting charging abnormality, and a storage medium. In this application, a first sampling moment corresponding to a first minimum voltage in n sampled voltages is determined based on n consecutive sampled voltages of a first cell from an end moment of an $i^{th}$ charging phase to an end moment of an $(i+1)^{th}$ charging phase in a $k^{th}$ charging process. A second sampling moment corresponding to a second minimum voltage in any one of the first $(k-1)^{th}$ charging processes can be determined in the same way. Then abnormality of the $k^{th}$ charging process is determined.

6 Claims, 3 Drawing Sheets

(56) References Cited

U.S. PATENT DOCUMENTS

| | | | | |
|---|---|---|---|---|
| 2013/0063079 A1* | 3/2013 | Kawai | ................ | H02J 7/00714 |
| | | | | 320/107 |
| 2022/0260640 A1* | 8/2022 | Tanaka | ................ | G01R 31/389 |
| 2022/0291290 A1* | 9/2022 | Takahashi | .......... | G01R 31/3648 |
| 2022/0326309 A1* | 10/2022 | Kallfelz | .................... | H02J 7/18 |
| 2022/0416559 A1* | 12/2022 | Choi | ................ | H02J 7/007182 |
| 2023/0105976 A1* | 4/2023 | Padhi | ................ | H02J 7/007194 |
| | | | | 320/152 |
| 2023/0198035 A1* | 6/2023 | Takahashi | ............ | H02J 7/0047 |
| | | | | 702/63 |
| 2023/0216324 A1* | 7/2023 | Tang | ................... | H01M 10/482 |
| | | | | 320/162 |
| 2024/0039063 A1* | 2/2024 | Xie | ................ | H01M 10/0525 |

FOREIGN PATENT DOCUMENTS

| | | | |
|---|---|---|---|
| CN | 102656048 | A | 9/2012 |
| CN | 110758173 | A | 2/2020 |
| CN | 111257775 | A | 6/2020 |
| CN | 112345944 | A | 2/2021 |
| EP | 0336381 | A2 | 10/1989 |
| WO | 2011067646 | A1 | 6/2011 |
| WO | 2012071809 | A1 | 6/2012 |

OTHER PUBLICATIONS

Written Opinion for International Application No. PCT/CN2021/085115, mailed Jan. 4, 2022.
Extended European Search Report for Application No. EP21765815.2, mailed Nov. 28, 2022.

\* cited by examiner

METHOD AND DEVICE FOR DETECTING CHARGING ABNORMALITY, AND STORAGE MEDIUM

CROSS-REFERENCE TO RELATED APPLICATIONS

This application is a continuation of International Patent Application No. PCT/CN2021/085115, filed on Apr. 1, 2021, which is incorporated herein by reference in its entirety.

TECHNICAL FIELD

Embodiments of this application relate to the technical field of battery charging, and in particular, to a method and device for detecting charging abnormality, and a storage medium.

BACKGROUND

Lithium-ion batteries are widely used in consumer electronic products by virtue of a relatively high energy density. With the development of powered vehicles, using a lithium-ion battery pack as a power source has become a current trend of lithium-ion batteries. Serving as an application system for controlling and managing charge-discharge cycles of a lithium-ion battery pack, a lithium-ion battery management system (BMS) controls the lithium-ion battery pack to charge and discharge in a specified mode. However, as the battery ages, battery performance declines, thereby posing safety risks when the battery is charged subsequently. Therefore, it is necessary to detect whether a battery charging process is abnormal.

Currently, the BMS generally uses the following two methods to detect whether the battery charging process is abnormal. The first method: When a voltage difference between a maximum voltage and a minimum voltage of any cell in the battery is greater than a voltage threshold in a charging process, it is considered that the battery containing the cell is abnormal in this charging process. The second method: In a charging process, the voltage of any cell in the battery drops abruptly, it is considered that the voltage attenuates abnormally, and therefore, it is considered that the battery containing the cell is abnormal in this charging process.

However, in the related art, an abnormal change of the voltage in the whole charging process is roughly equated with charging abnormality of the battery, thereby leading to a low accuracy and a high misjudgment rate.

SUMMARY

In view of the foregoing problems, embodiments of this application provide a battery, an electric device, and a battery charging method and device to ensure that a fully-charged capacity of a battery available for discharging does not attenuate with the aging of the battery.

According to a first aspect of the embodiments of this application, a method for detecting charging abnormality is provided. The method includes:

obtaining n consecutive sampled voltages of a first cell from an end moment of an $i^{th}$ charging phase to an end moment of an $(i+1)^{th}$ charging phase in a $k^{th}$ charging process of a battery, where the first cell is any one cell in the battery, a charge current in the $i^{th}$ charging phase is greater than a charge current in the $(i+1)^{th}$ charging phase, i is greater than or equal to 1, k is greater than or equal to 2, and n is greater than 2;

determining a first sampling moment corresponding to a first minimum voltage in the n sampled voltages based on the n consecutive sampled voltages; and determining abnormality of the $k^{th}$ charging process based on the first minimum voltage and a second minimum voltage, and/or based on a rate of change of the sampled voltages in a first period in the $k^{th}$ charging process and a rate of change of the sampled voltages in a second period in an $L^{th}$ charging process, where the second minimum voltage is a minimum voltage of the first cell from the end moment of the $i^{th}$ charging phase to the end moment of the $(i+1)^{th}$ charging phase in the $L^{th}$ charging process, a sampling moment of the second minimum voltage is a second sampling moment, and the $L^{th}$ charging process is any one of first $(k-1)^{th}$ charging processes; and, the first period is a period after the first sampling moment, the second period is a period after the second sampling moment, and a length of the first period is equal to a length of the second period.

In the embodiments of this application, a first sampling moment corresponding to a first minimum voltage in n sampled voltages is determined based on n consecutive sampled voltages of a first cell from an end moment of an $i^{th}$ charging phase to an end moment of an $(i+1)^{th}$ charging phase in a $k^{th}$ charging process. A second sampling moment corresponding to a second minimum voltage in any one of the first $(k-1)^{th}$ charging processes can be determined in the same way. Then abnormality of the $k^{th}$ charging process is determined based on the first minimum voltage and the second minimum voltage; or, abnormality of the $k^{th}$ charging process is determined based on a rate of change of the sampled voltages in a first period after the first sampling moment in the $k^{th}$ charging process and a rate of change of the sampled voltages in a second period after the second sampling moment in any one of the first $(k-1)^{th}$ charging processes. In this application, the charge current in the $i^{th}$ charging phase is greater than the charge current in the $(i+1)^{th}$ charging phase, and abnormality of the $k^{th}$ charging process is determined based on the change of the sampled voltages in a process of switching the battery from high-current charging to low-current charging, and/or based on the rate of change of the sampled voltage, so that the accuracy of detecting charging abnormality is improved and the misjudgment rate is reduced effectively.

Optionally, the n consecutive sampled voltages include an $m^{th}$ sampled voltage at an $m^{th}$ sampling moment to an $(m+n-1)^{th}$ sampled voltage at an $(m+n-1)^{th}$ sampling moment, and the determining a first sampling moment corresponding to a first minimum voltage in the n sampled voltages based on the n consecutive sampled voltages includes:

determining that the $m^{th}$ sampled voltage at the $m^{th}$ sampling moment is a minimum voltage;

updating the minimum voltage with the sampled voltage at the $(m+j)^{th}$ sampling moment if the sampled voltage at the $(m+j)^{th}$ sampling moment is less than the sampled voltage at the $(m+j-1)^{th}$ sampling moment; and determining, if the sampled voltage at the $(m+j)^{th}$ sampling moment is less than or equal to sampled voltages at an $(m+j+1)^{th}$ sampling moment to the $(m+n-1)^{th}$ sampling moment, that the $(m+j)^{th}$ sampling moment is the first sampling moment corresponding to the first minimum voltage, where j is greater than or equal to 1 and less than or equal to n−2, and m is greater than or equal to 1.

In the embodiments of this application, through the foregoing dynamic cyclic steps, the first sampling moment corresponding to the first minimum voltage is determined in parallel with the obtaining of the sampled voltages, thereby reducing the quantity of sampled voltages required to determine the first sampling moment corresponding to the first minimum voltage, improving the efficiency of determining the first sampling moment corresponding to the first minimum voltage, and reducing data processing pressure in the process.

Optionally, the determining abnormality of the $k^{th}$ charging process based on the first minimum voltage and a second minimum voltage includes:

determining abnormality of the $k^{th}$ charging process if the first minimum voltage is greater than the second minimum voltage.

As the charging cycles of the battery increase, an internal resistance of the battery increase. Therefore, when the battery switches from the high-current charging to the low-current charging, the voltage of the battery drops gradually. If the voltage of the battery increases instead of dropping in this switching process, it indicates that the internal resistance of the battery has decreased, and further indicates that the battery charging is abnormal. In the embodiments of this application, it is determined that the $k^{th}$ charging process is abnormal when the first minimum voltage in the $k^{th}$ charging process is greater than the second minimum voltage in any one of the first $(k-1)^{th}$ charging processes, so that the accuracy of detecting charging abnormality is improved and the misjudgment rate is reduced effectively.

Optionally, the determining abnormality of the $k^{th}$ charging process based on a rate of change of the sampled voltages in a first period in the $k^{th}$ charging process and a rate of change of the sampled voltages in a second period in an $L^{th}$ charging process includes:

determining abnormality of the $k^{th}$ charging process if the rate of change of the sampled voltages in the first period in the $k^{th}$ charging process is less than the rate of change of the sampled voltages in the second period in the $L^{th}$ charging process.

In the embodiments of this application, as the charging cycles of the battery increase, the internal resistance of the battery increase when the battery switches from the high-current charging to the low-current charging. The internal resistance of the battery can be measured by the rate of change of the sampled voltages that change over time. Therefore, based on this rule, in this application, the $k^{th}$ charging process is determined to be abnormal when the rate of change of the sampled voltages in the first period in the $k^{th}$ charging process is less than the rate of change of the sampled voltages in the second period in the $L^{th}$ charging process, so that the accuracy of detecting charging abnormality is improved and the misjudgment rate is reduced effectively.

Optionally, the method further includes:

updating a quantity of abnormal charging processes of the battery to obtain a cumulative quantity of abnormal charging processes; and stopping charging the battery when the cumulative quantity of abnormal charging processes exceeds a preset quantity.

In the embodiments of this application, the charging of the battery may be stopped when the cumulative quantity of abnormal charging processes exceeds a preset quantity, thereby ensuring safe charging of the battery. In addition, the BMS does not stop charging the battery until the cumulative quantity of abnormal charging processes exceeds the preset quantity, thereby avoiding mistaken stoppage of the charging of the battery in a case that charging abnormality of the battery is erroneously determined due to fluctuations of the sampled voltages.

Optionally, the charge current in the $i^{th}$ charging phase is a first current, the charge current in the $(i+1)^{th}$ charging phase is a second current, the first current is greater than the second current, and the obtaining n consecutive sampled voltages of a first cell from an end moment of an $i^{th}$ charging phase to an end moment of an $(i+1)^{th}$ charging phase in a $k^{th}$ charging process includes:

switching the first current to the second current directly if a current difference between the first current and the second current is greater than a current threshold, and obtaining the n sampled voltages from the $m^{th}$ sampling moment to the $(m+n-1)^{th}$ sampling moment after the first current is switched to the second current; and switching, if the current difference is less than or equal to the current threshold, the first current to a third current, and then switching the third current to the second current, and obtaining the n sampled voltages from the $m^{th}$ sampling moment to the $(m+n-1)^{th}$ sampling moment after the third current is switched to the second current, where the third current is greater than the first current.

In the embodiments of this application, when the current difference between the first current and the second current is less than or equal to the current threshold, the first current is switched to the third current that is higher, and then the third current is switched to the second current. The n sampled voltages are obtained at the $m^{th}$ sampling moment to the $(m+n-1)^{th}$ sampling moment after the third current is switched to the second current. In this way, a characteristic signal of the sampled voltages can be amplified so that the abnormality of the $k^{th}$ charging process can be determined accurately.

According to a second aspect of the embodiments of this application, a device for detecting charging abnormality is provided. The device includes:

a processing module, configured to obtain n consecutive sampled voltages of a first cell from an end moment of an $i^{th}$ charging phase to an end moment of an $(i+1)^{th}$ charging phase in a $k^{th}$ charging process of a battery, where the first cell is any one cell in the battery, a charge current in the $i^{th}$ charging phase is greater than a charge current in the $(i+1)^{th}$ charging phase, i is greater than or equal to 1, k is greater than or equal to 2, and n is greater than 2.

The processing module is further configured to determine a first sampling moment corresponding to a first minimum voltage in the n sampled voltages based on the n consecutive sampled voltages.

The processing module is further configured to determine abnormality of the $k^{th}$ charging process based on the first minimum voltage and a second minimum voltage, and/or based on a rate of change of the sampled voltages in a first period in the $k^{th}$ charging process and a rate of change of the sampled voltages in a second period in an $L^{th}$ charging process.

The second minimum voltage is a minimum voltage of the first cell from the end moment of the $i^{th}$ charging phase to the end moment of the $(i+1)^{th}$ charging phase in the $L^{th}$ charging process, a sampling moment of the second minimum voltage is a second sampling moment, and the $L^{th}$ charging process is any one of first $(k-1)^{th}$ charging processes; and, the first period is a period after the first sampling moment, the second period is a period after the second sampling moment, and a length of the first period is equal to a length of the second period.

Optionally, the n consecutive sampled voltages include an $m^{th}$ sampled voltage at an $m^{th}$ sampling moment to an $(m+n-1)^{th}$ sampled voltage at an $(m+n-1)^{th}$ sampling moment, and the processing module is further configured to:
determine that the $m^{th}$ sampled voltage at the $m^{th}$ sampling moment is a minimum voltage;
update the minimum voltage with the sampled voltage at the $(m+j)^{th}$ sampling moment if the sampled voltage at the $(m+j)^{th}$ sampling moment is less than the sampled voltage at the $(m+j-1)^{th}$ sampling moment; and
determine, if the sampled voltage at the $(m+j)^{th}$ sampling moment is less than or equal to sampled voltages at an $(m+j+1)^{th}$ sampling moment to the $(m+n-1)^{th}$ sampling moment, that the $(m+j)^{th}$ sampling moment is the first sampling moment corresponding to the first minimum voltage, where j is greater than or equal to 1 and less than or equal to n−2, and m is greater than or equal to 1.

Optionally, the processing module is further configured to: determine abnormality of the $k^{th}$ charging process if the first minimum voltage is greater than the second minimum voltage.

Optionally, the processing module is further configured to:
determine abnormality of the $k^{th}$ charging process if the rate of change of the sampled voltages in the first period in the $k^{th}$ charging process is less than the rate of change of the sampled voltages in the second period in the $L^{th}$ charging process.

Optionally, the processing module is further configured to:
update a quantity of abnormal charging processes of the battery to obtain a cumulative quantity of abnormal charging processes.

The device for detecting charging abnormality further includes: a charging module, configured to stop charging the battery when the cumulative quantity of abnormal charging processes exceeds a preset quantity.

Optionally, the charge current in the $i^{th}$ charging phase is a first current, the charge current in the $(i+1)^{th}$ charging phase is a second current, the first current is greater than the second current, and the processing module is further configured to:
switch the first current to the second current directly if a current difference between the first current and the second current is greater than a current threshold, and obtain the n sampled voltages from the $m^{th}$ sampling moment to the $(m+n-1)^{th}$ sampling moment after the first current is switched to the second current; and
switch, if the current difference is less than or equal to the current threshold, the first current to a third current, and then switch the third current to the second current, and obtain the n sampled voltages from the $m^{th}$ sampling moment to the $(m+n-1)^{th}$ sampling moment after the third current is switched to the second current, where the third current is greater than the first current.

According to a third aspect of the embodiments of this application, a battery is provided. The battery includes the device for detecting charging abnormality according to the second aspect.

According to a fourth aspect of the embodiments of this application, a charging device is provided, and is configured to charge a battery. The charging device includes the device for detecting charging abnormality according to the second aspect.

According to a fifth aspect of the embodiments of this application, a computer-readable storage medium is provided, on which a computer program is stored. When executed by a processor, the computer program implements the method for detecting charging abnormality according to the first aspect.

According to a sixth aspect of the embodiments of this application, an electronic device is provided, including:
a processor; and
a memory, configured to store an executable instruction of the processor, where
the processor is configured to implement the method for detecting charging abnormality according to the first aspect by executing the executable instruction.

In the embodiments of this application, a first sampling moment corresponding to a first minimum voltage in n sampled voltages is determined based on n consecutive sampled voltages of a first cell from an end moment of an $i^{th}$ charging phase to an end moment of an $(i+1)^{th}$ charging phase in a $k^{th}$ charging process. A second sampling moment corresponding to a second minimum voltage in any one of the first $(k-1)^{th}$ charging processes can be determined in the same way. Then abnormality of the $k^{th}$ charging process is determined based on the first minimum voltage and the second minimum voltage; or, abnormality of the $k^{th}$ charging process is determined based on a rate of change of the sampled voltages in a first period after the first sampling moment in the $k^{th}$ charging process and a rate of change of the sampled voltages in a second period after the second sampling moment in any one of the first $(k-1)^{th}$ charging processes. In this application, the charge current in the $i^{th}$ charging phase is greater than the charge current in the $(i+1)^{th}$ charging phase, and abnormality of the $k^{th}$ charging process is determined based on the change of the sampled voltages in a process of switching the battery from high-current charging to low-current charging, and/or based on the rate of change of the sampled voltage, so that the accuracy of detecting charging abnormality is improved and the misjudgment rate is reduced effectively.

BRIEF DESCRIPTION OF DRAWINGS

To describe the technical solutions in the embodiments of this application more clearly, the following outlines the drawings required for describing the embodiments. Evidently, the drawings outlined below are merely a part of embodiments of this application. A person of ordinary skill in the art may derive other drawings from the drawings without making any creative efforts.

DETAILED DESCRIPTION

To make the objectives, technical solutions, and advantages of the embodiments of this application clearer, the following gives a clear and complete description of the technical solutions in the embodiments of this application with reference to the drawings in the embodiments of this application. Apparently, the described embodiments are merely a part of but not all of the embodiments of this application. All other embodiments derived by a person of ordinary skill in the art based on the embodiments of this application without making any creative efforts shall fall within the protection scope of this application.

Unless otherwise defined, all technical and scientific terms used herein have the same meanings as usually understood by a person skilled in the technical field of this application. The terms used in the specification of this application are merely intended for describing specific embodiments but not intended to limit this application.

Reference to "embodiment" herein means that a specific feature, structure or characteristic described with reference to the embodiment may be included in at least one embodiment of this application. The reference to the term "embodiment" in different places in the specification does not necessarily represent the same embodiment, nor does it represent an independent or alternative embodiment in a mutually exclusive relationship with other embodiments. A person skilled in the art explicitly and implicitly understands that the embodiments described herein may be combined with other embodiments.

Figure 1:
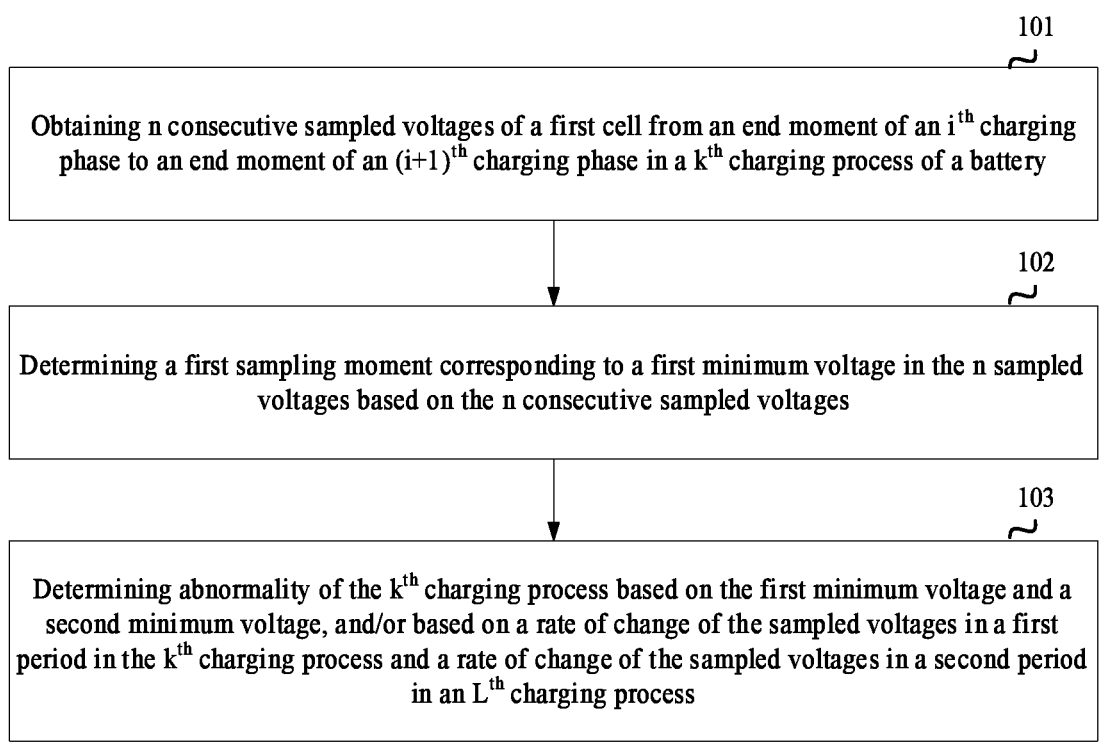
FIG. 1 is a schematic flowchart of a method for detecting charging abnormality according to an embodiment of this application.

FIG. 1 is a schematic flowchart of a method for detecting charging abnormality according to an embodiment of this application. The method is applicable to a device for detecting charging abnormality. The device includes a main body and a battery disposed in the main body, and the battery is configured to provide electrical energy. The device may be a vehicle such as a new energy vehicle. The new energy vehicle may be a battery electric vehicle, a hybrid electric vehicle, a range-extended electric vehicle, or the like. A drive motor is disposed in the main body of the vehicle. The drive motor is electrically connected to the battery. The battery provides electrical energy for the drive motor. The drive motor is connected to wheels on the main body of the vehicle through a transmission mechanism to drive the vehicle to move. Alternatively, the device may be an unmanned aerial vehicle, a ship, or the like.

In terms of the type of the battery, the battery in the embodiments of this application may be a lithium-ion battery, a lithium metal battery, a lead-acid battery, a nickel-cadmium battery, a nickel-hydrogen battery, a lithium-sulfur battery, a lithium-air battery, a sodium-ion battery, or the like, and is not specifically limited in the embodiments of this application. In terms of the size of the battery, the battery can be a cell or battery cell, or a battery module or a battery pack, and is not specifically limited in the embodiments of this application. In addition, the battery in the embodiments of this application includes a battery management system (BMS). To be specific, the method may be applied to the BMS. Nevertheless, the BMS in the embodiments of this application may also be a stand-alone device or apparatus. Through the BMS, the abnormal charging of the battery can be detected by using the method for detecting charging abnormality according to the embodiments of this application. As shown in FIG. 1, the method includes the following steps.

Step 101: Obtaining n consecutive sampled voltages of a first cell from an end moment of an $i^{th}$ charging phase to an end moment of an $(i+1)^{th}$ charging phase in a $k^{th}$ charging process of a battery.

The first cell is any one cell in the battery, a charge current in the $i^{th}$ charging phase is greater than a charge current in the $(i+1)^{th}$ charging phase, i is greater than or equal to 1, k is greater than or equal to 2, and n is greater than 2.

Step 102: Determining a first sampling moment corresponding to a first minimum voltage in the n sampled voltages based on the n consecutive sampled voltages.

Step 103: Determining abnormality of the $k^{th}$ charging process based on the first minimum voltage and a second minimum voltage, and/or based on a rate of change of the sampled voltages in a first period in the $k^{th}$ charging process and a rate of change of the sampled voltages in a second period in an $L^{th}$ charging process.

The second minimum voltage is a minimum voltage of the first cell from the end moment of the $i^{th}$ charging phase to the end moment of the $(i+1)^{th}$ charging phase in the $L^{th}$ charging process, a sampling moment of the second minimum voltage is a second sampling moment, and the $L^{th}$ charging process is any one of first $(k-1)^{th}$ charging processes; and, the first period is a period after the first sampling moment, the second period is a period after the second sampling moment, and a length of the first period is equal to a length of the second period.

As the charging cycles of the battery increase, an internal resistance of the battery increase. Therefore, when the battery switches from the high-current charging to the low-current charging, the voltage of the battery drops gradually. If the voltage of the battery increases instead of dropping in this switching process, it indicates that the internal resistance of the battery has decreased, and further indicates that the battery charging is abnormal.

In this embodiment of this application, a first sampling moment corresponding to a first minimum voltage in n sampled voltages is determined based on n consecutive sampled voltages of a first cell from an end moment of an $i^{th}$ charging phase to an end moment of an $(i+1)^{th}$ charging phase in a $k^{th}$ charging process. A second sampling moment corresponding to a second minimum voltage in any one of the first $(k-1)^{th}$ charging processes can be determined in the same way. Then abnormality of the $k^{th}$ charging process is determined based on the first minimum voltage and the second minimum voltage; or, abnormality of the $k^{th}$ charging process is determined based on a rate of change of the sampled voltages in a first period after the first sampling moment in the $k^{th}$ charging process and a rate of change of the sampled voltages in a second period after the second sampling moment in any one of the first $(k-1)^{th}$ charging processes. In this application, the charge current in the $i^{th}$ charging phase is greater than the charge current in the $(i+1)^{th}$ charging phase, and abnormality of the $k^{th}$ charging process is determined based on the change of the sampled voltages in a process of switching the battery from high-current charging to low-current charging, and/or based on the rate of change of the sampled voltage, so that the accuracy of detecting charging abnormality is improved and the misjudgment rate is reduced effectively.

Figure 2:
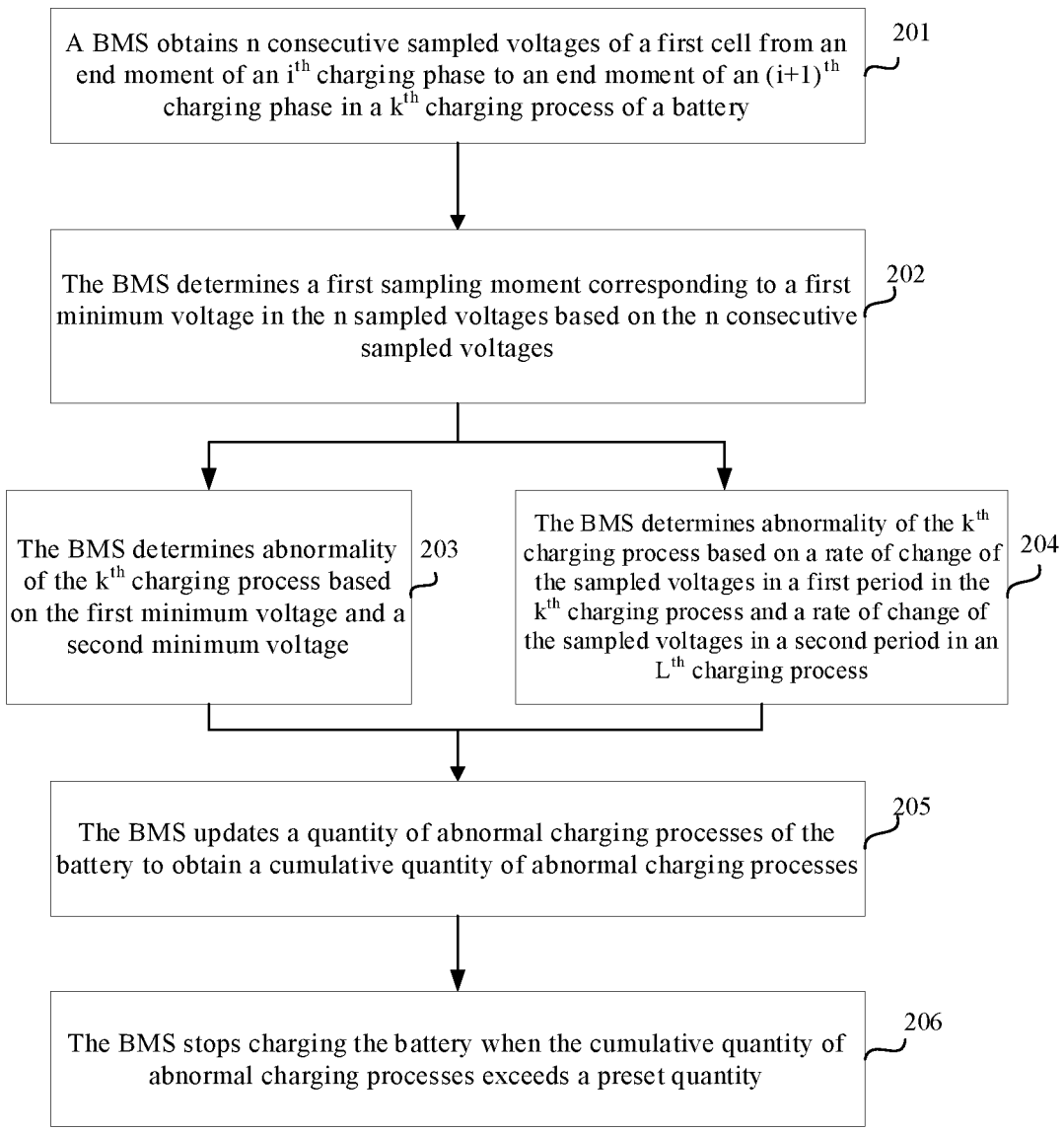
FIG. 2 is a schematic flowchart of another method for detecting charging abnormality according to an embodiment of this application.

FIG. 2 is a schematic flowchart of another method for detecting charging abnormality according to an embodiment of this application. The following description uses an example in which a battery is charged by a charging pile, but this embodiment of this application does not limit the means of charging the battery. As shown in FIG. 2, the method includes the following steps.

Step 201: A BMS obtains n consecutive sampled voltages of a first cell from an end moment of an $i^{th}$ charging phase to an end moment of an $(i+1)^{th}$ charging phase in a $k^{th}$ charging process of a battery.

The battery includes a plurality of cells. The first cell is any one of the cells in the battery. A charge current in the $i^{th}$ charging phase is greater than a charge current in the $(i+1)^{th}$ charging phase, i is greater than or equal to 1, k is greater than or equal to 2, and n is greater than 2.

It needs to be noted that currently, the battery is usually charged by using a step charging method. Any charging process of the battery includes a plurality of charging phases. A charge current is constant in all charging phases. The charge current in one charging phase is greater than the charging current in a next charging phase. In this way, in each charging process of the battery, the battery is charged for a phase at a relatively high charge current, and then the relatively high charge current is switched to a relatively low charge current to charge the battery for another phase, and so on, thereby completing a single charging process of the battery. In this way, the current is switched for several times in each charging process of the battery. A current switching point exists between two adjacent charging phases, and the current switching point corresponds to an end moment of the previous charging phase.

For example, the $k^{th}$ charging process of the battery may include a $1^{st}$ charging phase, a $2^{nd}$ charging phase, and a $3^{rd}$ charging phase. The charge current in the $1^{st}$ charging phase may be 300 A (amperes), the charge current in the $2^{nd}$ charging phase may be 200 A, and the charge current in the $3^{rd}$ charging phase may be 150 A. Therefore, in the $k^{th}$ charging process of the battery, the current is switched for 2 times, and 2 current switching points exist. The charge current is switched from 300 A to 200 A at the $1^{st}$ time of current switching, and the charge current is switched from 200 A to 150 A at the $2^{nd}$ time of current switching. The end moment of the $1^{st}$ charging phase corresponds to the $1^{st}$ current switching point, and the end moment of the $2^{nd}$ charging phase corresponds to the $2^{nd}$ current switching point. Understandably, the charging phase and the charge current may be set or adjusted based on system design or requirements, and are not limited in this embodiment of this application.

In addition, in the $k^{th}$ charging process of the battery, the BMS can obtain consecutive sampled voltages of any cell in the battery, and can obtain consecutive sampled voltages between any two adjacent current switching points of the cell. According to this embodiment of this application, abnormality of the $k^{th}$ charging process of the battery can be determined based on the consecutive sampled voltages between any two adjacent current switching points of any cell in the battery. This is not limited in this embodiment of this application.

Further, in the $k^{th}$ charging process of the battery, the BMS may collect the n consecutive sampled voltages between any two adjacent current switching points of any cell in the battery in real time. Nevertheless, in order to reduce energy consumption of sampling, a sampling interval may be preset. The voltages are collected at intervals of the preset sampling interval to obtain n consecutive sampled voltages. For example, the sampling interval may be 100 milliseconds (ms), 110 ms, 150 ms, or the like, and is not limited in this embodiment of this application.

Using the n consecutive sampled voltages from the end moment of the $i^{th}$ charging phase to the end moment of the $(i+1)^{th}$ charging phase in the $k^{th}$ charging process as an example, the n consecutive sampled voltages may all sampled voltages from the end moment of the $i^{th}$ charging phase to the end moment of the $(i+1)^{th}$ charging phase in the $k^{th}$ charging process. To reduce the pressure of data processing, the n consecutive sampled voltages may be a part of the sampled voltages between the end moment of the $i^{th}$ charging phase and the end moment of the $(i+1)^{th}$ charging phase in the $k^{th}$ charging process. However, regardless of the quantity of this part of sampled voltages, this part of consecutive sampled voltages need to include the first minimum voltage corresponding to the first sampling moment, a sampled voltage that is continuous with the first minimum voltage and collected before the first sampling moment, and a sampled voltage that is continuous with the first minimum voltage and collected after the first sampling moment.

Optionally, the quantity of sampled voltages that are continuous with the first minimum voltage and collected after the first sampling moment, which are included in this part of sampled voltages, may be greater than or equal to 2, so as to avoid decline of the accuracy of the determining in step 202 below due to fluctuations of the sampled voltages, where the determining is to determine the first sampling moment corresponding to the first minimum voltage in the n sampled voltages.

For example, it is assumed that 6 sampled voltages exist between the end moment of the $i^{th}$ charging phase and the end moment of the $(i+1)^{th}$ charging phase in the $k^{th}$ charging process of the battery, and the end moment of the $i^{th}$ charging phase corresponds to the $1^{st}$ sampled voltage, and so on, and the first sampling moment between the end moment of the $i^{th}$ charging phase and the end moment of the $(i+1)^{th}$ charging phase corresponds to the $4^{th}$ sampled voltage (that is, the first minimum voltage), and so on, and the end moment of the $(i+1)^{th}$ charging phase corresponds to the $6^{th}$ sampled voltage. In other words, there are 6 consecutive sampled voltages in chronological order. Therefore, in this embodiment of this application, the BMS can obtain the 6 consecutive sampled voltages, and detects abnormality of the $k^{th}$ charging process of the battery based on the 6 consecutive sampled voltages. Alternatively, the BMS may obtain a part of consecutive sampled voltages in the 6 consecutive sampled voltages, and detect abnormality of the $k^{th}$ charging process of the battery based on this part of consecutive sampled voltages. For example, this part of consecutive sampled voltages may be 3 consecutive sampled voltages, and the 3 consecutive sampled voltages may include the $3^{rd}$ to $5^{th}$ sampled voltages. Alternatively, this part of sampled voltages may be 4 consecutive sampled voltages, and the 4 consecutive sampled voltages may include the $3^{rd}$ to $6^{th}$ sampled voltages, or may include the $2^{nd}$ to $5^{th}$ sampled voltages. Alternatively, this part of sampled voltages may be 5 consecutive sampled voltages, and the 5 consecutive sampled voltages may include the $2^{nd}$ to $6^{th}$ sampled voltages, or may include the $1^{st}$ to $5^{th}$ sampled voltages.

In some embodiments, it is assumed that the charge current in the $i^{th}$ charging phase is a first current, the charge current in the $(i+1)^{th}$ charging phase is a second current, and the first current is greater than the second current. However, when a current difference between the first current and the second current is relatively small, voltage characteristic signals of the n consecutive sampled voltages of the first cell from the end moment of the $i^{th}$ charging phase to the end moment of the $(i+1)^{th}$ charging phase will be inconspicuous. This is adverse to accurately determining abnormality of the $k^{th}$ charging process. Therefore, an excitation current may be added between the first current and the second current to amplify the voltage characteristic signals.

Specifically, when the BMS obtains n consecutive sampled voltages of the first cell from the end moment of the $i^{th}$ charging phase to the end moment of the $(i+1)^{th}$ charging phase, a current threshold may be preset, and the current difference between the first current and the second current may be compared with the current threshold. The first current is switched to the second current directly if the current difference between the first current and the second current is greater than the current threshold, and the n sampled voltages are obtained from the $m^{th}$ sampling moment to the $(m+n-1)^{th}$ sampling moment after the first current is switched to the second current. If the current difference is less than or equal to the current threshold, the first current is switched to a third current, and then the third current is switched to the second current, and the n sampled voltages are obtained from the $m^{th}$ sampling moment to the $(m+n-1)^{th}$ sampling moment after the third current is switched to the second current, where the third current is greater than the first current.

For example, the current threshold is 70 A, the first current is 30 A, and the second current is 25 A. Because 30 A minus 25 A is 5 A and 5 A is less than 70 A, if the current is directly switched from 30 A to 25 A, the voltage characteristic signals of the sampled voltages obtained after the current is switched from 30 A to 25 A will be inconspicuous, thereby being adverse to accurately determining abnormality of the $k^{th}$ charging process. Therefore, the third current may be set to 100 A, and the current is switched from 30 A to 100 A, and then switched from 100 A to 25 A, thereby implementing the switching from the first current to the second current. Because 100 A minus 25 A is 75 A and 75 A is greater than 70 A, the voltage characteristic signals of the sampled voltages obtained after the current is switched from 100 A to 25 A will be relatively conspicuous, thereby being conducive to accurately determining abnormality of the $k^{th}$ charging process.

Step 202: The BMS determines a first sampling moment corresponding to a first minimum voltage in the n sampled voltages based on the n consecutive sampled voltages.

In a possible implementation, the BMS may sort the n consecutive sampled voltages in descending order, determine that the lowest-ranking sampled voltage is the first minimum voltage, and determine that the sampling moment corresponding to the first minimum voltage is the first sampling moment. In a first example, the n consecutive sampled voltages are 5 consecutive sampled voltages. The 5 consecutive sampled voltages are 180 volt (V), 165 V, 125 V, 139 V, and 150 V respectively in chronological order of sampling. The 5 consecutive sampled voltages are ranked 180 V>165 V>150 V>139 V>125 V, where 125 V is the lowest-ranking sampled voltage. Therefore, 125 V may be determined to be the first minimum voltage, and the sampling moment corresponding to 125 V may be determined to be the first sampling moment.

When a plurality of minimum sampled voltages exist in the n consecutive sampled voltages, in other words, when last few sampled voltages in the n consecutive sampled voltages are the same, any one of the plurality of minimum sampled voltages may be determined to be the first minimum voltage; or, a sampled voltage that is sampled at an earliest sampling moment among the plurality of minimum sampled voltages is determined to be the first minimum voltage, and the sampling moment corresponding to the first minimum voltage is determined to be the first sampling moment. In a second example, the n consecutive sampled voltages are 5 consecutive sampled voltages. The 5 sampled voltages are 180 V, 165 V, 139 V, 139 V, and 139 V respectively in chronological order of sampling. The 5 sampled voltages are ranked 180 V>165 V>139 V=139 V=139 V, where there are 3 minimum sampled voltages 139 V. Therefore, 139 V may be determined to be the first minimum voltage, and the sampling moment corresponding to the 139 V that is earliest sampled in terms of sampling moment among the 3 identical voltage values 139 V may be determined to be the first sampling moment.

In another possible implementation, the n consecutive sampled voltages include an $m^{th}$ sampled voltage at an $m^{th}$ sampling moment to an $(m+n-1)^{th}$ sampled voltage at an $(m+n-1)^{th}$ sampling moment. The BMS may implement step 202 by performing steps (1) to (3) below.

Step (1): Determining that the $m^{th}$ sampled voltage at the $m^{th}$ sampling moment is a minimum voltage; Step (2): Updating the minimum voltage with the sampled voltage at the $(m+j)^{th}$ sampling moment if the sampled voltage at the $(n+j)^{th}$ sampling moment is less than the sampled voltage at the $(m+j-1)^{th}$ sampling moment; and Step (3): Determining, if the sampled voltage at the $(m+j)^{th}$ sampling moment is less than or equal to sampled voltages at an $(m+j+1)^{th}$ sampling moment to the $(m+n-1)^{th}$ sampling moment, that the $(m+j)^{th}$ sampling moment is the first sampling moment corresponding to the first minimum voltage, where j is greater than or equal to 1 and less than or equal to n−2, and m is greater than or equal to 1.

It needs to be noted that, in order to determine the first sampling moment corresponding to the first minimum voltage in the n consecutive sampled voltages, an initial value may be assigned to the minimum voltage, and then a subsequent sampled voltage is compared with the initial value. This process is repeated to determine a real value of the minimum voltage. The real value is determined to be the first minimum voltage, and the sampling moment corresponding to the real value is determined to be the first sampling moment.

In a first scenario, referring to the exemplary values in the first example above, n is equal to 5, and it is assumed that m is equal to 1, the $1^{st}$ sampled voltage at the $1^{st}$ sampling moment in the 5 consecutive sampled voltages is 180 V, and the $2^{nd}$ sampled voltage at the $2^{nd}$ sampling moment is 165 V, the $3^{rd}$ sampled voltage at the $3^{rd}$ sampling moment is 125 V, the $4^{th}$ sampled voltage at the $4^{th}$ sampling moment is 139 V, and the $5^{th}$ sampled voltage at the $5^{th}$ sampling moment is 150 V. Therefore, the $1^{st}$ sampled voltage 180 V at the $1^{st}$ sampling moment may be determined to be the minimum voltage through step (1) first. When j is equal to 1, in step (2), because the sampled voltage 165 V at the $2^{nd}$ sampling moment is less than 180 V, the minimum voltage is updated with the sampled voltage 165 V at the $2^{nd}$ sampling moment. That is, the minimum voltage is updated from 180 V to 165 V. In step (3), because the sampled voltage 165 V at the $2^{nd}$ sampling moment is greater than the sampled voltage 125 V at the $3^{rd}$ sampling moment, the process returns to step (2). When j is equal to 2, in step (2), because the sampled voltage 125 V at the $3^{rd}$ sampling moment is less than 165 V, the minimum voltage is updated with the sampled voltage 125 V at the $3^{rd}$ sampling moment. That is, the minimum voltage is updated from 165 V to 125 V. In step (3), because the sampled voltage 125 V at the $3^{rd}$ sampling moment is less than the sampled voltage 139 V at the $4^{th}$ sampling moment and less than the sampled voltage 150 V at the $5^{th}$ sampling moment, the $3^{rd}$ sampling moment is determined to be the first sampling moment, and 125 V is determined to be the first minimum voltage.

In a second scenario, referring to the exemplary values in the second example above, n is equal to 5, and it is assumed that m is equal to 1, the $1^{st}$ sampled voltage at the $1^{st}$ sampling moment in the 5 consecutive sampled voltages is 180 V, and the $2^{nd}$ sampled voltage at the $2^{nd}$ sampling moment is 165 V, the $3^{rd}$ sampled voltage at the $3^{rd}$ sampling moment is 139 V, the $4^{th}$ sampled voltage at the $4^{th}$ sampling moment is 139 V, and the $5^{th}$ sampled voltage at the $5^{th}$ sampling moment is 139 V. Therefore, the $1^{st}$ sampled voltage 180 V at the $1^{st}$ sampling moment may be determined to be the minimum voltage through step (1) first. When j is equal to 1, in step (2), because the sampled voltage 165 V at the $2^{nd}$ sampling moment is less than 180 V, the minimum voltage is updated with the sampled voltage 165 V at the $2^{nd}$ sampling moment. That is, the minimum voltage is updated from 180 V to 165 V. In step (3), because the sampled voltage 165 V at the $2^{nd}$ sampling moment is greater than the sampled voltage 139 V at the $3^{rd}$ sampling moment, the process returns to step (2). When j is equal to 2, in step (2), because the sampled voltage 139 V at the $3^{rd}$ sampling moment is less than 165 V, the minimum voltage is updated with the sampled voltage 139 V at the $3^{rd}$ sampling moment. That is, the minimum voltage is updated from 165 V to 139 V. In step (3), because the sampled voltage 139 V at the $3^{rd}$ sampling moment is equal to the sampled voltage 139 V at the $4^{th}$ sampling moment and equal to the sampled voltage 139 V at the $5^{th}$ sampling moment, the $3^{rd}$ sampling moment is determined to be the first sampling moment, and 139 V is determined to be the first minimum voltage.

It needs to be noted that, through the foregoing dynamic cyclic steps (1) to (3), the first sampling moment corresponding to the first minimum voltage is determined in parallel with the obtaining of the sampled voltages, thereby reducing the quantity of sampled voltages required to determine the first sampling moment corresponding to the first minimum voltage, improving the efficiency of determining the first sampling moment corresponding to the first minimum voltage, and reducing data processing pressure in the process.

It needs to be further noted that in this application, the first minimum voltage in the n consecutive sampled voltage of the first cell and the first sampling moment corresponding to the first minimum voltage can be determined based on the n consecutive sampled voltages of the first cell from the end moment of the $i^{th}$ charging phase to the end moment of the $(i+1)^{th}$ charging phase in the $k^{th}$ charging process. For any one of the first $(k-1)^{th}$ charging processes of the battery, the BMS may, in the way described above in the $k^{th}$ charging process, determine a second minimum voltage of the first cell in this charging process, and a second sampling moment corresponding to the second minimum voltage. The second minimum voltage is a minimum voltage of the first cell in the consecutive samples from the end moment of the $i^{th}$ charging phase to the end moment of the $(i+1)^{th}$ charging phase in the $L^{th}$ charging process, and the $L^{th}$ charging process is any one of the first $(k-1)^{th}$ charging processes. Subsequently, the BMS may store the data of the charging process, the sampling phase, the minimum voltage in the sampling phase, and the sampling moment of the minimum voltage correspondingly for future use.

Step 203: The BMS determines abnormality of the $k^{th}$ charging process based on the first minimum voltage and a second minimum voltage.

As the charging cycles of the battery increase, an internal resistance of the battery increase. Therefore, when the battery switches from the high-current charging to the low-current charging, the voltage of the battery drops gradually. If the voltage of the battery increases instead of dropping in this switching process, it indicates that the internal resistance of the battery has decreased, and further indicates that the battery charging is abnormal. Therefore, whether the $k^{th}$ charging process is abnormal can be determined based on comparison between the first minimum voltage in the $k^{th}$ charging process and the second minimum voltage in any one of the first $(k-1)^{th}$ charging processes.

For example, an implementation process of step 203 may be: determining abnormality of the $k^{th}$ charging process if the first minimum voltage is greater than the second minimum voltage.

The BMS can determine abnormality of the $k^{th}$ charging process when determining that the first minimum voltage is greater than the second minimum voltage. In addition, the BMS can determine abnormality of the $k^{th}$ charging process when determining that the first minimum voltage in the $k^{th}$ charging process is greater than the second minimum voltage in any one of the first $(k-1)^{th}$ charging processes. For example, it is assumed that k is equal to 3, the first minimum voltage determined by the BMS based on the sampled voltage in the $3^{rd}$ charging process is 125 V, the second minimum voltage determined based on the sampled voltage in the $1^{st}$ charging process is 120 V, and the second minimum voltage determined based on the sampled voltage in the $2^{nd}$ charging process is 110 V. Because 125 V is greater than 120 V, the BMS determines that the $k^{th}$ charging process is abnormal. Alternatively, because 125 V is greater than 110 V, the BMS determines that the $k^{th}$ charging process is abnormal.

In practical applications, the BMS may determine abnormality of the $k^{th}$ charging process by other means based on the first minimum voltage and the second minimum voltage, and the means is not limited in this embodiment of this application.

It needs to be noted that as the charging cycles of the battery increase, when the battery switches from the high-current charging to the low-current charging, the voltage of the battery drops gradually. In this embodiment of this application, based on this rule, it is determined that the $k^{th}$ charging process is abnormal when the first minimum voltage in the $k^{th}$ charging process is greater than the second minimum voltage in any one of the first $(k-1)^{th}$ charging processes, so that the accuracy of detecting charging abnormality is improved and the misjudgment rate is reduced effectively.

Step 204: The BMS determines abnormality of the $k^{th}$ charging process based on a rate of change of the sampled voltages in a first period in the $k^{th}$ charging process and a rate of change of the sampled voltages in a second period in an $L^{th}$ charging process.

The first period is a period after the first sampling moment, the second period is a period after the second sampling moment, and a length of the first period is equal to a length of the second period. A start moment of the first period may be the first sampling moment, and an end moment of the first period may be the $1^{st}$ sampling moment after the first sampling moment, or the $2^{nd}$ or $3^{rd}$ sampling moment after the first sampling moment, or the like. A start moment of the second period may be the second sampling moment, and an end moment of the second period may be the $1^{st}$ sampling moment after the second sampling moment, or the $2^{nd}$ or $3^{rd}$ sampling moment after the second sampling moment, or the like. The start moment and the end moment are not limited in this embodiment of this application so long as the length of the first period is ensured to be equal to the length of the second period to cause the rate of change of the sampled voltages in the first period in the $k^{th}$ charging process to be comparable to the rate of change of the sampled voltages in the second period in the $L^{th}$ charging process.

Optionally, the end moment of the first period is at least the $2^{nd}$ sampling moment after the first sampling moment, and the end moment of the second period is at least the $2^{nd}$ sampling moment after the second sampling moment, so as to avoid decline of the accuracy of the rate of change of the sampled voltages in the first period in the $k^{th}$ charging process and the rate of change of the sampled voltages in the second period in the $L^{th}$ charging process, where the decline is caused by fluctuations of the sampled voltages.

As the charging cycles of the battery increase, an internal resistance of the battery increase. Therefore, when the battery switches from the high-current charging to the low-current charging, the voltage of the battery drops gradually. If the internal resistance of the battery decreases instead of increasing in this switching process, it further indicates that the battery charging is abnormal. The internal resistance of the battery can be measured by the rate of change of the sampled voltages that change over time. Therefore, whether the $k^{th}$ charging process is abnormal can be determined based on comparison between the rate of change of the sampled voltages in the first period in the $k^{th}$ charging process and the rate of change of the sampled voltages in the second period in the $L^{th}$ charging process.

For example, the implementation process of step 204 may be: determining abnormality of the $k^{th}$ charging process if the rate of change of the sampled voltages in the first period in the $k^{th}$ charging process is less than the rate of change of the sampled voltages in the second period in the $L^{th}$ charging process.

The BMS can determine abnormality of the $k^{th}$ charging process if the rate of change of the sampled voltages in the first period in the $k^{th}$ charging process is less than the rate of change of the sampled voltages in the second period in the first $(k-1)^{th}$ charging processes. In addition, the BMS can determine abnormality of the $k^{th}$ charging process if the rate of change of the sampled voltages in the first period in the $k^{th}$ charging process is less than the rate of change of the sampled voltages in the second period in any of the first $(k-1)^{th}$ charging processes. For example, it is assumed that: k is equal to 3; the rate of change of the sampled voltages in the first period, which is determined by the BMS based on the sampled voltages in the $3^{rd}$ charging process, is 4; the rate of change of the sampled voltages in the second period, which is determined based on the sampled voltages in the $1^{st}$ charging process, is 4.5; and the rate of change of the sampled voltages in the second period, which is determined based on the sampled voltages in the $2^{nd}$ charging process, is 5. Because 4 is less than 4.5, the BMS determines that the $k^{th}$ charging process is abnormal. Alternatively, because 4 is less than 5, the BMS determines that the $k^{th}$ charging process is abnormal.

When determining the rate of change of the sampled voltages in the first period in the $k^{th}$ charging process, the BMS may subtract the first minimum voltage from a last sampled voltage in the first period to obtain a first voltage difference, and then divide the first voltage difference by a length of the first period to obtain the rate of change of the sampled voltages in the first period in the $k^{th}$ charging process. Similarly, when determining the rate of change of the sampled voltages in the second period in the $L^{th}$ charging process, the BMS may subtract the second minimum voltage from a last sampled voltage in the second period to obtain a second voltage difference, and then divide the second voltage difference by a length of the second period to obtain the rate of change of the sampled voltages in the second period in the $L^{th}$ charging process.

In practical applications, the BMS may determine abnormality of the $k^{th}$ charging process by other means based on the rate of change of the sampled voltages in the first period in the $k^{th}$ charging process and the rate of change of the sampled voltages in the second period in the $L^{th}$ charging process, and the means is not limited in this embodiment of this application.

It needs to be noted that as the charging cycles of the battery increase, when the battery switches from the high-current charging to the low-current charging, the internal resistance of the battery increases. The internal resistance of the battery can be measured by the rate of change of the sampled voltages that change over time. Therefore, based on this rule, in this application, the $k^{th}$ charging process is determined to be abnormal when the rate of change of the sampled voltages in the first period in the $k^{th}$ charging process is less than the rate of change of the sampled voltages in the second period in the $L^{th}$ charging process, so that the accuracy of detecting charging abnormality is improved and the misjudgment rate is reduced effectively.

It needs to be further noted that, in this embodiment of this application, after the first sampling moment corresponding to the first minimum voltage in the $k^{th}$ charging process and the second sampling moment corresponding to the second minimum voltage in any one of the first $(k-1)^{th}$ charging processes are determined through steps 201 and 202, abnormality of the $k^{th}$ charging process may be determined through step 203 alone, or abnormality of the $k^{th}$ charging process may be determined through step 204 alone, or abnormality of the $k^{th}$ charging process may be determined through both step 203 and step 204. This is not limited in this embodiment of this application.

It needs to be noted that the BMS in this embodiment of this application may detect and obtain the sampled voltages of each cell in the battery, and determine abnormality of battery charging based on the sampled voltages of any cell. Therefore, this application can not only accurately determine whether the battery charging is abnormal, but also determine the specific cell that has caused the charging abnormality in the battery. For example, if abnormality of the $k^{th}$ charging process is determined based on the sampled voltages of the first cell, the BMS can determine that the first cell of the battery has caused the abnormality of the $k^{th}$ charging process of the battery.

In this embodiment of this application, after the abnormality of the $k^{th}$ charging process is determined through the foregoing steps, the battery charging can be further controlled through the following steps 205 and 206 to avoid safety problems caused by the continued charging of the battery after the battery charging is abnormal.

Step 205: The BMS updates a quantity of abnormal charging processes of the battery to obtain a cumulative quantity of abnormal charging processes.

After the abnormality of the charging is determined each time, the BMS may count and update the quantity of abnormal charging processes of the battery to obtain the cumulative quantity of abnormal charging processes. For example, in updating the quantity of abnormal charging processes of the battery, the quantity of abnormal charging processes may be increased by a preset value whenever an abnormal charging process is determined. The preset value may be 1, 2, 3, and so on. For example, before the $k^{th}$ charging process, the counted quantity of abnormal charging processes of the battery is 2. If it is determined that the $k^{th}$ charging process is abnormal and the preset value is 1, then the quantity of abnormal charging processes may be increased by 1 to obtain 3 as a cumulative quantity of abnormal charging processes.

It needs to be noted that the BMS in this embodiment of this application may detect and obtain the consecutive sampled voltages of each cell in the battery, and determine abnormality of battery charging based on the consecutive sampled voltages of any cell. Therefore, in counting the quantity of abnormal charging processes of the battery, the counting may be performed for each different cell to obtain a cumulative quantity of abnormal charging processes related to the cell. For example, it is assumed that the battery includes a first cell, a second cell, and a third cell. Before the $k^{th}$ charging process, the counted quantity of abnormal battery charging processes related to the first cell is 2, the quantity of abnormal battery charging processes related to the second cell is 3, the quantity of abnormal charging processes related to the third cell is 0, and the preset value is 1. If abnormality of the $k^{th}$ charging process is determined based on the consecutive sampled voltages of the first cell, the quantity of abnormal charging processes related to the first cell may be increased by 1 so that the cumulative abnormal charging processes related to the first cell is 3. If abnormality of the $k^{th}$ charging process is determined based on the sampled voltages of the second cell, the quantity of abnormal charging processes related to the second cell may be increased by 1 so that the cumulative abnormal charging processes related to the second cell is 4. If abnormality of the $k^{th}$ charging process is determined based on the sampled voltages of the third cell, the quantity of abnormal charging processes related to the third cell may be increased by 1 so that the cumulative abnormal charging processes related to the third cell is 1.

It needs to be further noted that each charging process of the battery includes a plurality of charging phases and current switching points, and the abnormality of the $k^{th}$ charging process of the battery can be determined based on the consecutive sampled voltages between any two adjacent current switching points. However, in counting the quantity of abnormal charging processes of the battery, in a single charging process of the same cell, regardless of the two adjacent current switching points between which the consecutive sampled voltages are used as a basis for determining the abnormality of the battery charging, the quantity of abnormal charging processes updated due to abnormality of this charging process can be updated for at most one time. Using the first cell in the battery as an example, it is assumed that the $k^{th}$ charging process of the battery includes a $1^{st}$ current switching point, a $2^{nd}$ current switching point, and a $3^{rd}$ current switching point, and the counted quantity of abnormal charging processes of the battery before the $k^{th}$ charging process is 2. If abnormality of the $k^{th}$ charging process is determined based on the consecutive sampled voltages between the $1^{st}$ current switching point and the $2^{nd}$ current switching point, and the abnormality of the $k^{th}$ charging process is also determined based on the consecutive sampled voltages between the $2^{nd}$ current switching point and the $3^{rd}$ current switching point, and the preset value is 1, then the quantity of abnormal charging processes can be updated for only 1 time to obtain 3 as the cumulative quantity of abnormal charging processes, but the quantity of abnormal charging processes cannot be updated for 2 times and the cumulative quantity of abnormal charging processes cannot be updated to 4.

Step 206: The BMS stops charging the battery when the cumulative quantity of abnormal charging processes exceeds a preset quantity.

It needs to be noted that the preset quantity may be set in advance, and the preset quantity may be set as needed. For example, the preset quantity may be 5, 6, or the like. After obtaining the cumulative quantity of abnormal charging processes, the BMS may determine whether the cumulative quantity of abnormal charging processes exceeds the preset quantity, and, stop charging the battery if the cumulative quantity of abnormal charging processes exceeds the preset quantity, or, continue charging the battery if the cumulative quantity of abnormal charging processes does not exceed the preset quantity. In this way, safe charging of the battery is ensured.

In this embodiment of this application, the BMS can communicate with a charging pile. A charging socket may be disposed on a device for detecting charging abnormality. When a charging gun is plugged into the charging socket under control of the charging pile, a battery in the device for detecting charging abnormality can be charged. When the charging gun is unplugged from the charging socket under control of the charging pile, the charging of the battery in the device for detecting charging abnormality can be ended. When it is determined that the cumulative quantity of abnormal charging processes exceeds the preset quantity, the BMS may send an end-of-charging indication to the charging pile. Correspondingly, the charging pile can receive the indication, and, based on the indication, control the charging gun to get unplugged from the charging socket to stop charging the battery. When it is determined that the cumulative quantity of abnormal charging processes is less than or equal to the preset quantity, the BMS does not send an end-of-charging indication to the charging pile. Correspondingly, the charging pile does not control the charging gun to get unplugged from the charging socket, so as to continue charging the battery.

It needs to be noted that a preset quantity is set in this embodiment of this application, and the charging of the battery is stopped when the cumulative quantity of abnormal charging processes exceeds the preset quantity, thereby ensuring safe charging of the battery. In addition, the BMS does not stop charging the battery until the cumulative quantity of abnormal charging processes exceeds the preset quantity, thereby avoiding mistaken stoppage of the charging of the battery in a case that charging abnormality of the battery is erroneously determined due to fluctuations of the sampled voltages.

Further, when it is determined that the cumulative quantity of abnormal charging processes exceeds the preset quantity, the BMS may raise a safety alarm to send out charging abnormality information in time.

In some embodiments, an alarm unit may be disposed in the battery in this embodiment of this application. The alarm unit may communicate with the BMS. When it is determined that the cumulative quantity of abnormal charging processes exceeds the preset quantity, the BMS may send an alarm indication to the alarm unit. Correspondingly, the alarm unit may receive the indication and send out an alarm based on the indication.

The alarm unit may include at least one of a buzzer or an alarm indicator. For example, in a case that the alarm unit includes a buzzer and an alarm indicator, when it is determined that the cumulative quantity of abnormal charging processes exceeds the preset quantity, the BMS may send an alarm indication to the buzzer and the alarm indicator concurrently or sequentially. Upon receiving the indication, the buzzer may buzz to the outside at a frequency. Upon receiving the indication, the alarm indicator may be controlled to light up, or the alarm indicator may be controlled to flash at a frequency. This is not limited in this embodiment of this application.

It needs to be noted that when it is determined that the cumulative quantity of abnormal charging processes exceeds the preset quantity, a safety alarm is raised, so that the charging abnormality information can be sent out in time to avoid significant loss. In addition, the BMS does not raise the safety alarm until the cumulative quantity of abnormal charging processes exceeds the preset quantity, thereby avoiding mistaken alarms in a case that charging abnormality of the battery is erroneously determined due to fluctuations of the sampled voltages.

In this embodiment of this application, a first sampling moment corresponding to a first minimum voltage in n sampled voltages is determined based on n consecutive sampled voltages of a first cell from an end moment of an $i^{th}$ charging phase to an end moment of an $(i+1)^{th}$ charging phase in a $k^{th}$ charging process. A second sampling moment corresponding to a second minimum voltage in any one of the first $(k-1)^{th}$ charging processes can be determined in the same way. Then abnormality of the $k^{th}$ charging process is determined based on the first minimum voltage and the second minimum voltage; or, abnormality of the $k^{th}$ charging process is determined based on a rate of change of the sampled voltages in a first period after the first sampling moment in the $k^{th}$ charging process and a rate of change of the sampled voltages in a second period after the second sampling moment in any one of the first $(k-1)^{th}$ charging processes. In this application, the charge current in the $i^{th}$ charging phase is greater than the charge current in the $(i+1)^{th}$ charging phase, and abnormality of the $k^{th}$ charging process is determined based on the change of the sampled voltages in a process of switching the battery from high-current charging to low-current charging, and/or based on the rate of change of the sampled voltage, so that the accuracy of detecting charging abnormality is improved and the misjudgment rate is reduced effectively.

Figure 3:
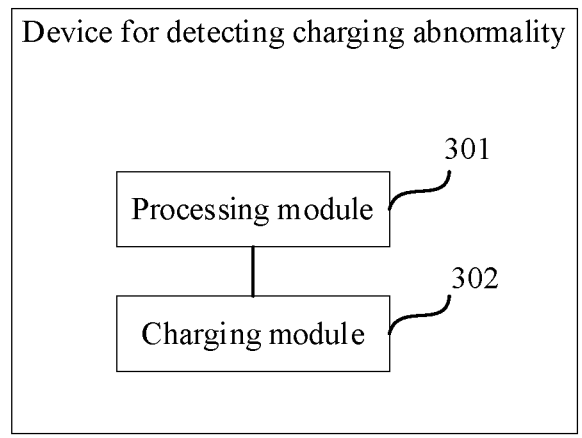
FIG. 3 is a schematic structural diagram of a device for detecting charging abnormality according to an embodiment of this application.

FIG. 3 is a schematic structural diagram of a device for detecting charging abnormality according to an embodiment of this application. As shown in FIG. 3, the device for detecting charging abnormality includes: a processing module 301 and a charging module 302.

The processing module 301 is configured to obtain n consecutive sampled voltages of a first cell from an end moment of an $i^{th}$ charging phase to an end moment of an $(i+1)^{th}$ charging phase in a $k^{th}$ charging process of a battery, where the first cell is any one cell in the battery, a charge current in the $i^{th}$ charging phase is greater than a charge current in the $(i+1)^{th}$ charging phase, i is greater than or equal to 1, k is greater than or equal to 2, and n is greater than 2.

The processing module 301 is further configured to determine a first sampling moment corresponding to a first minimum voltage in the n sampled voltages based on the n consecutive sampled voltages.

The processing module 301 is further configured to determine abnormality of the $k^{th}$ charging process based on the first minimum voltage and a second minimum voltage, and/or based on a rate of change of the sampled voltages in a first period in the $k^{th}$ charging process and a rate of change of the sampled voltages in a second period in an $L^{th}$ charging process.

The second minimum voltage is a minimum voltage of the first cell from the end moment of the $i^{th}$ charging phase to the end moment of the $(i+1)^{th}$ charging phase in the $L^{th}$ charging process, a sampling moment of the second minimum voltage is a second sampling moment, and the $L^{th}$ charging process is any one of first $(k-1)^{th}$ charging processes; and, the first period is a period after the first sampling moment, the second period is a period after the second sampling moment, and a length of the first period is equal to a length of the second period.

Optionally, the n consecutive sampled voltages include an $m^{th}$ sampled voltage at an $m^{th}$ sampling moment to an $(m+n-1)^{th}$ sampled voltage at an $(m+n-1)^{th}$ sampling moment, and the processing module 301 is further configured to: determine that the $m^{th}$ sampled voltage at the $m^{th}$ sampling moment is a minimum voltage; update the minimum voltage with the sampled voltage at the $(m+j)^{th}$ sampling moment if the sampled voltage at the $(m+j)^{th}$ sampling moment is less than the sampled voltage at the $(m+j-1)^{th}$ sampling moment; and determine, if the sampled voltage at the $(m+j)^{th}$ sampling moment is less than or equal to sampled voltages at an $(m+j+1)^{th}$ sampling moment to the $(m+n-1)^{th}$ sampling moment, that the $(m+j)^{th}$ sampling moment is the first sampling moment corresponding to the first minimum voltage, where j is greater than or equal to 1 and less than or equal to n−2, and m is greater than or equal to 1.

Optionally, the processing module 301 is further configured to: determine abnormality of the $k^{th}$ charging process if the first minimum voltage is greater than the second minimum voltage.

Optionally, the processing module 301 is further configured to: determine abnormality of the $k^{th}$ charging process if the rate of change of the sampled voltages in the first period in the $k^{th}$ charging process is less than the rate of change of the sampled voltages in the second period in the $L^{th}$ charging process.

Optionally, the processing module 301 is further configured to: update a quantity of abnormal charging processes of the battery to obtain a cumulative quantity of abnormal charging processes.

The device for detecting charging abnormality further includes: a charging module 302, configured to stop charging the battery when the cumulative quantity of abnormal charging processes exceeds a preset quantity.

Optionally, the charge current in the $i^{th}$ charging phase is a first current, the charge current in the $(i+1)^{th}$ charging phase is a second current, the first current is greater than the second current, and the processing module 301 is further configured to: switch the first current to the second current directly if a current difference between the first current and the second current is greater than a current threshold, and obtain the n sampled voltages from the $m^{th}$ sampling moment to the $(m+n-1)^{th}$ sampling moment after the first current is switched to the second current; and switch, if the current difference is less than or equal to the current threshold, the first current to a third current, and then switch the third current to the second current, and obtain the n sampled voltages from the $m^{th}$ sampling moment to the $(m+n-1)^{th}$ sampling moment after the third current is switched to the second current, where the third current is greater than the first current.

In this embodiment of this application, a first sampling moment corresponding to a first minimum voltage in n sampled voltages is determined based on n consecutive sampled voltages of a first cell from an end moment of an $i^{th}$ charging phase to an end moment of an $(i+1)^{th}$ charging phase in a $k^{th}$ charging process. A second sampling moment corresponding to a second minimum voltage in any one of the first $(k-1)^{th}$ charging processes can be determined in the same way. Then abnormality of the $k^{th}$ charging process is determined based on the first minimum voltage and the second minimum voltage; or, abnormality of the $k^{th}$ charging process is determined based on a rate of change of the sampled voltages in a first period after the first sampling moment in the $k^{th}$ charging process and a rate of change of the sampled voltages in a second period after the second sampling moment in any one of the first $(k-1)^{th}$ charging processes. In this application, the charge current in the $i^{th}$ charging phase is greater than the charge current in the $(i+1)^{th}$ charging phase, and abnormality of the $k^{th}$ charging process is determined based on the change of the sampled voltages in a process of switching the battery from high-current charging to low-current charging, and/or based on the rate of change of the sampled voltage, so that the accuracy of detecting charging abnormality is improved and the misjudgment rate is reduced effectively.

Specific working methods of each module in the device in the foregoing embodiment have been described in detail in the method embodiment, and will not be described here in detail.

It needs to be understood that the units in the foregoing device are merely divided in terms of logical functions, and in actual implementation, may be integrated into one physical entity in whole or in part, or may be physically separated. The units in the device may be all implemented in the form of software invoked by a processing element; or may be all implemented in the form of hardware; or may be partly implemented in the form of software invoked by a processing element and partly implemented in the form of hardware. For example, each unit may be a stand-alone processing element, or may be integrated in a chip of the device. The unit may be stored in a memory in the form of a program, and the program is invoked by a processing element of the device to perform a function of the unit. In addition, all or some of the units may be integrated together, or may be implemented independently. The processing element referred to herein may be an integrated circuit capable of processing signals. In an implementation process, each step in the foregoing method or each of the foregoing units may be implemented by an integrated logical circuit of hardware in the processing element, or may be implemented in the form of software invoked by the processing element.

An embodiment of this application further provides a battery, including a device for detecting charging abnormality according to the embodiment shown in FIG. 3.

An embodiment of this application further provides a charging device. The charging device is configured to charge a battery. The charging device includes the device for detecting charging abnormality according to the embodiment shown in FIG. 3.

An embodiment of this application further provides a computer-readable storage medium, on which a computer program is stored. When executed by a processor, the computer program implements the method for detecting charging abnormality according to the embodiments shown in FIG. 1 to FIG. 2.

The computer-readable storage medium may include an electronic circuit, a semiconductor storage device, a read-only memory (ROM), a flash memory, an erasable ROM (EROM), a floppy disk, a CD-ROM, an optical disk, a hard disk, optical fiber media, a radio frequency (RF) link, and the like, which are not limited herein.

Figure 4:
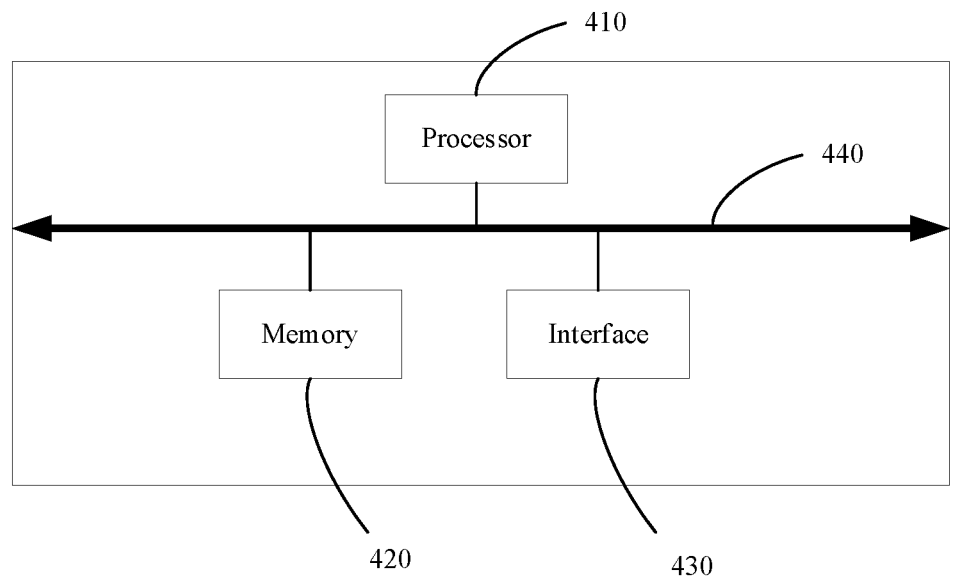
FIG. 4 is a schematic structural diagram of another device for detecting charging abnormality according to an embodiment of this application.

FIG. 4 is a schematic structural diagram of another device for detecting charging abnormality according to an embodiment of this application. Referring to FIG. 4, the device for detecting charging abnormality includes: a processor 410, a memory 420, and an interface 430. The processor 410, the memory 420, and the interface 430 are connected by a bus 440. The bus may be implemented by a connecting circuit. The memory 420 is configured to store a program. When invoked by the processor 410, the program can implement the method performed by the device for detecting charging abnormality according to the foregoing embodiment. The interface 430 is configured to implement communication with other devices for detecting charging abnormality. The interface 430 can communicate with other devices for detecting charging abnormality through a wired connection or a wireless connection.

The functions of each unit of the device for detecting charging abnormality may be implemented by the processor 410 by invoking a program stored in the memory 420. That is, the device for detecting charging abnormality includes a processor 410 and a memory 420. The memory 420 is configured to store a program, and the program is invoked by the processor 410 to perform the method according to the foregoing method embodiment. The processor 410 herein may be a general-purpose processor or other processors that can invoke a programs; or the processor 410 may be one or more integrated circuits configured to perform the method for detecting charging abnormality according to the foregoing embodiment, for example, one or more application-specific integrated circuits (ASIC), or, one or more microprocessors (digital signal processors, DSPs), or, one or more field programmable gate arrays (FPGAs), or other programmable logic devices, discrete gates or transistor logic devices, discrete hardware components, or the like. For another example, when a unit in the device for detecting charging abnormality can be implemented in the form of a processor invoking a program, the processor 410 may be a general-purpose processor, for example, a central processing unit (CPU), a controller, a micro control unit, a single-chip microcomputer, or another processor that can invoke a program. For another example, the units may be integrated together and implemented in the form of a system-on-a-chip.

The quantity of the memory 420 is not limited, and may be one or more.

The memory 420 includes at least one type of readable storage medium. The readable storage medium includes a non-volatile memory or a volatile memory, for example, a flash memory, a hard disk, a multimedia card, a card-type memory (such as an SD or a DX memory), a random access memory (RAM), a read-only memory (ROM), an erasable programmable read-only memory (EPROM), an electrically erasable programmable read-only memory (EEPROM), a programmable read-only memory (PROM), a magnetic memory, a magnetic disk, or an optical disk. The RAM may include a static RAM or a dynamic RAM. In some embodiments, the memory 420 may be an internal memory of the device, for example, a hard disk or an internal storage of the device. In other embodiments, the memory 420 may be an external storage device of the device, for example, a plug-in hard disk, a smart memory card (SMC), a secure digital (SD) card, a flash card, or the like that inserted on the device. Alternatively, the memory 420 may include both an internal memory of the device and an external storage device. In this embodiment, the memory 420 is generally configured to store an operating system and various applications installed in the device, for example, program code of the method for detecting charging abnormality. In addition, the memory 420 may be configured to temporarily store all types of data already output or to be output.

The bus 440 may be an Industry Standard Architecture (ISA) bus, a Peripheral Component Interconnect (PCI) bus, or an Extended Industry Standard Architecture (EISA) bus, or the like. The bus 440 may include an address bus, a data bus, a control bus, and the like. For ease of representation, the bus is denoted by just one bold line in the drawing, but this does not mean that there is only one bus or only one type of bus.

The processor 410 is generally configured to control overall operations of the device. In this embodiment, the memory 420 is configured to store program code or instructions. The program code includes computer operation instructions. The processor 410 is configured to execute the program code or instructions stored in the memory 420 or to process data, for example, execute the program code of the method for detecting charging abnormality.

In conclusion, a first sampling moment corresponding to a first minimum voltage in n sampled voltages is determined based on n consecutive sampled voltages of a first cell from an end moment of an $i^{th}$ charging phase to an end moment of an $(i+1)^{th}$ charging phase in a $k^{th}$ charging process. A second sampling moment corresponding to a second minimum voltage in any one of the first $(k-1)^{th}$ charging processes can be determined in the same way. Then abnormality of the $k^{th}$ charging process is determined based on the first minimum voltage and the second minimum voltage; or, abnormality of the $k^{th}$ charging process is determined based on a rate of change of the sampled voltages in a first period after the first sampling moment in the $k^{th}$ charging process and a rate of change of the sampled voltages in a second period after the second sampling moment in any one of the first $(k-1)^{th}$ charging processes. In this application, the charge current in the $i^{th}$ charging phase is greater than the charge current in the $(i+1)^{th}$ charging phase, and abnormality of the $k^{th}$ charging process is determined based on the change of the sampled voltages in a process of switching the battery from high-current charging to low-current charging, and/or based on the rate of change of the sampled voltage, so that the accuracy of detecting charging abnormality is improved and the misjudgment rate is reduced effectively.

A person skilled in the art understands that although some embodiments herein include some features included in other embodiments rather than other features, a combination of features of different embodiments is intended to fall within the scope of this application and form a different embodiment. For example, any one of the claimed embodiments in the claims may be used in any combination.

Overall, the foregoing embodiments are merely intended to describe the technical solutions of this application but not to limit this application. Although this application is described in detail with reference to the foregoing embodiments, a person of ordinary skill in the art understands that modifications may still be made to the technical solutions described in the foregoing embodiments or equivalent replacements may be made to some technical features thereof. Such modifications or replacements do not make the essence of the corresponding technical solutions depart from the scope of the technical solutions of the embodiments of this application.

What is claimed is:

1. A method for detecting charging abnormality, wherein the method comprises:
    obtaining n consecutive sampled voltages of a first cell from an end moment of an $i^{th}$ charging phase to an end moment of an $(i+1)^{th}$ charging phase in a $k^{th}$ charging process of a battery, wherein the first cell is any one cell in the battery, a first charge current in the $i^{th}$ charging phase is greater than a second charge current in the $(i+1)^{th}$ charging phase, i is greater than or equal to 1, k is greater than or equal to 2, and n is greater than 2, wherein the n consecutive sampled voltages comprise an $m^{th}$ sampled voltage at an $m^{th}$ sampling moment to an $(m+n-1)^{th}$ sampled voltage at an $(m+n-1)^{th}$ sampling moment,
    wherein obtaining n consecutive sampled voltages of a first cell from an end moment of an $i^{th}$ charging phase to an end moment of an $(i+1)^{th}$ charging phase in a $k^{th}$ charging process comprises:
        switching the first current to the second current directly if a current difference between the first current and the second current is greater than a current threshold, and obtaining the n sampled voltages from the $m^{th}$ sampling moment to the $(m+n-1)^{th}$ sampling moment after the first current is switched to the second current; switching, if the current difference is less than or equal to the current threshold, the first current to a third current, and then switching the third current to the second current, and obtaining the n sampled voltages from the $m^{th}$ sampling moment to the $(m+n-1)^{th}$ sampling moment after the third current is switched to the second current, wherein the third current is greater than the first current; and
    determining a first sampling moment corresponding to a first minimum voltage in the n sampled voltages based on the n consecutive sampled voltages, comprising:
        determining that the $m^{th}$ sampled voltage at the $m^{th}$ sampling moment is a minimum voltage;
        updating the minimum voltage with the sampled voltage at the $(m+j)^{th}$ sampling moment if the sampled voltage at the $(m+j)^{th}$ sampling moment is less than the sampled voltage at the $(m+j-1)^{th}$ sampling moment;
        determining, if the sampled voltage at the $(m+j)^{th}$ sampling moment is less than or equal to sampled voltages at an $(m+j+1)^{th}$ sampling moment to the $(m+n-1)^{th}$ sampling moment, that the $(m+j)^{th}$ sampling moment is the first sampling moment corresponding to the first minimum voltage, wherein j is greater than or equal to 1 and less than or equal to n−2, and m is greater than or equal to 1; and
        determining abnormality of the $k^{th}$ charging process if the first minimum voltage is greater than a second minimum voltage, and determining abnormality of the $k^{th}$ charging process if the rate of change of the sampled voltages in a first period in the $k^{th}$ charging process is less than the rate of change of the sampled voltages in a second period in a $L^{th}$ charging process,
    wherein
    the second minimum voltage is a minimum voltage of the first cell from the end moment of the $i^{th}$ charging phase to the end moment of the $(i+1)^{th}$ charging phase in the $L^{th}$ charging process, a sampling moment of the second minimum voltage is a second sampling moment, and the $L^{th}$ charging process is any one of first $(k-1)^{th}$ charging processes; and,
    the first period is a period after the first sampling moment, the second period is a period after the second sampling moment, and a length of the first period is equal to a length of the second period.

2. The method according to claim 1, wherein the method further comprises:
    updating a quantity of abnormal charging processes of the battery to obtain a cumulative quantity of abnormal charging processes; and
    stopping charging the battery when the cumulative quantity of abnormal charging processes exceeds a preset quantity.

3. A device for detecting charging abnormality, wherein the device comprises means for performing the method according to claim 1.

4. A battery, wherein the battery comprises the device for detecting charging abnormality according to claim 3.

5. A charging device, configured to charge a battery, wherein the charging device comprises the device for detecting charging abnormality according to claim 3.

6. A non-transitory computer-readable storage medium on which a computer program is stored, wherein, when executed by a processor, the computer program implements the method for detecting charging abnormality according to claim 1.

* * * * *